(12) United States Patent
Chen et al.

(10) Patent No.: US 12,155,010 B2
(45) Date of Patent: Nov. 26, 2024

(54) SMALL-SIZE VERTICAL-TYPE LIGHT EMITTING DIODE CHIP WITH HIGH LUMINOUS IN CENTRAL REGION

(71) Applicant: EXCELLENCE OPTO. INC., Miaoli County (TW)

(72) Inventors: Fu-Bang Chen, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 502 days.

(21) Appl. No.: 17/672,047

(22) Filed: Feb. 15, 2022

(65) Prior Publication Data

US 2023/0261140 A1    Aug. 17, 2023

(51) Int. Cl.
*H01L 33/38* (2010.01)
*H01L 33/62* (2010.01)
*H01L 33/00* (2010.01)
*H01L 33/14* (2010.01)
*H01L 33/30* (2010.01)
(Continued)

(52) U.S. Cl.
CPC ............ *H01L 33/38* (2013.01); *H01L 33/62* (2013.01); *H01L 33/0008* (2013.01); *H01L 33/14* (2013.01); *H01L 33/305* (2013.01); *H01L 33/325* (2013.01); *H01L 33/405* (2013.01); *H01L 33/42* (2013.01)

(58) Field of Classification Search
CPC ... H01L 33/0093; H01L 33/38; H01L 33/405; H01L 33/44; H01L 33/62; H01L 25/0753; H01L 25/0756; H01L 25/13; H01L 27/153; H01L 27/156; H01L 33/0091; H01L 33/20; H01L 33/382; H01L 33/387; H01L 33/46; H01L 33/48; H01L 33/50; H01L 33/60; H01L 33/0008; H01L 33/14; H01L 33/305; H01L 33/325; H01L 33/42
USPC ............................................................ 257/76
See application file for complete search history.

(56) References Cited

U.S. PATENT DOCUMENTS

2014/0151711 A1 * 6/2014 Yen ................ H01L 33/44
                                                       257/98
2019/0164945 A1 * 5/2019 Chae ................ H01L 25/13

FOREIGN PATENT DOCUMENTS

CN        105826443 A  *  8/2016  ............ H01L 33/38

OTHER PUBLICATIONS

Moon, Ji-Hyung, CN 105826443 A, "Lighting Device And Lighting System" (Year: 2016).*

* cited by examiner

*Primary Examiner* — Jami Valentine Miller
*Assistant Examiner* — Ashley Nicole Blackwell
(74) *Attorney, Agent, or Firm* — MUNCY, GEISSLER, OLDS & LOWE, P.C.

(57) ABSTRACT

Disclosed is a small-size vertical-type light emitting diode chip with high luminous in a central region. A PN junction structure is arranged on a light emitting region base of an interface structure, the interface structure is provided with a P-type Ohmic contact area at the light emitting region base, a central area of the PN junction structure is above the P-type Ohmic contact area, an insulating layer is formed on an extending platform adjacent to the light emitting region base and extends to cover an N-type semiconductor of the PN junction structure to form a border covering region surrounding the N-type semiconductor, an N-type Ohmic contact electrode covers the border covering region, and an N-type electrode pad is arranged on the insulating layer and (Continued)

electrically connected with the N-type Ohmic contact electrode via a bridging connected metal layer.

13 Claims, 11 Drawing Sheets

(51) Int. Cl.
*H01L 33/32* (2010.01)
*H01L 33/40* (2010.01)
*H01L 33/42* (2010.01)

SMALL-SIZE VERTICAL-TYPE LIGHT EMITTING DIODE CHIP WITH HIGH LUMINOUS IN CENTRAL REGION

FIELD OF THE INVENTION

The present invention discloses a chip structure for a light emitting diode, and particularly discloses a small-size vertical-type light emitting diode chip with emitting light focusing on a central region.

BACKGROUND OF THE INVENTION

Based on appearance, electrode arrangement and current directions of semiconductor layers, light emitting diode (LED) chips may be mainly divided into three types: 1. a horizontal type, 2. a vertical type and 3. a flip-chip type, wherein small-size horizontal-type LED chips and small-size vertical-type LED chips have relatively low luminous efficiency, so high-grade small-pitch LED display screens mainly adopt the flip-chip type small-size chips with relatively good luminous efficiency at present. The flip-chip type small-size chips are surface mounted components (SMD) without a need for connecting electrode pads on the light emitting surfaces in a wire bonding manner, and an N electrode and a P electrode below the chips are conductively bonded to package carriers through the electrode pads, so that the light emitting surfaces on the chips are not shaded by the electrodes, and the flip-chip type small-size chips are better in luminous efficiency compared with small-size luminous.

However, that the N electrode and the P electrode are arranged at the bottoms of the small-size chip at the same time to be conductively bonded to the carriers leads to the disadvantage that short circuits easily occur due to too small electrode pads and pitches. The small-size chips also have relatively poor heat dissipation compared with vertical-type LEDs on the whole surfaces of the bottoms, and there may be doubts on reliability on the small-size chips under the condition of use for vehicles. Moreover, phosphide red-light flip-chip type LED chips are much complex in manufacturing process compared with nitride blue-green light flip-chip type LED chips, and the cost of flip-chip type LED chips with chips growing on non-sapphire substrates is much higher than that of the vertical-type LEDs. Thus, the vertical-type LEDs have an advantage in aspect of the reliability when being used for the vehicles, but the luminous efficiency is relatively poor. If the light emitting efficiency can be improved, development of vehicle small-size LED displays with high reliability demands is facilitated.

As shown in FIG. 1, a conventional vertical-type light emitting diode structure comprises a P-type electrode 1, a chip conductive substrate 2, a reflecting layer 3, an interface structure 4, a PN junction structure 5 and an N-type electrode pad 6, wherein the chip conductive substrate 2 comprises a structure metal layer 2A, an substitute substrate bonding layer 2B and an substitute substrate 2C, and the interface structure 4 is a partial P-type Ohmic contact metal layer and contains a P-type Ohmic contact area 4A and a non-P-type-Ohmic contact area 4B. The PN junction structure 5 contains a P-type semiconductor 5A, an active layer 5B and an N-type semiconductor 5C. Although having high axial light and good heat dissipation performance, the vertical-type light emitting diode is beneficial to color rendering operation under the high temperature condition. However, the straight side length of a traditional small-size vertical-type light emitting diode chip is about 200 μm. Light-absorption interfering substances, such as a cutting channel, a side wall and a metal layer conduction layer, occupy a necessary dimension of about 40 μm as requiring to be arranged at the edge of the chip; as shown in FIG. 2, as the N-type electrode pad 6 (N electrode) is arranged in the central region on the N-type semiconductor 5C (light emitting surface), luminous in the central is shaded; and the N-type electrode pad 6 is located above the active layer 5B and the N-type semiconductor 5C, and micro-fractures or defects of the active layer 5B are easily caused during wire bonding due to extremely small areas of both the chip and the electrode pad. Also, reference lines 6A (Finger) are generally provided above the N-type semiconductor 5C in an interdigitated finger shape. The more the reference lines 6A are arranged on the N-type semiconductor 5C, although the better the dispersion of a current is, the shading area may also be increased. Thus, the luminous efficiency and the reliability of the traditional small-size vertical-type LED are both poorer than those of the small-size flip-chip type LED; however, the high axial light and high heat dissipation performance of the traditional small-size vertical-type LED are more favorably used for a vehicle small-pitch display with high contrast.

SUMMARY OF THE INVENTION

A main objective of the present invention is to provide a small-size vertical-type light emitting diode chip with high luminous in a central region, whereas the light emitting surface may emit light from the upper side without shading, and the demand on high luminous efficiency is achieved.

The present invention discloses a small-size vertical-type light emitting diode chip with high luminous in a central region, comprising a P-type electrode, a chip conductive substrate, an interface structure, a PN junction structure, an insulating layer, a bridging connected metal layer, an N-type Ohmic contact electrode and an N-type electrode pad. The P-type electrode is arranged on one side of the chip conductive substrate. The interface structure is arranged on one side of the chip conductive substrate opposite to the P-type electrode. The interface structure comprises a highly-conductive metal layer, a partial P-type Ohmic contact layer and a high-concentration P-type semiconductor layer which are stacked in sequence. The high-concentration P-type semiconductor layer is light-transmitting. The interface structure further comprises a light emitting region base and an extending platform, and the extending platform is adjacent to the light emitting region base. The PN junction structure comprises a P-type semiconductor, an active layer and an N-type semiconductor which are stacked in sequence, the P-type semiconductor is arranged on the light emitting region base, and the PN junction structure is a closed figure with four straight sides to form a central area. A ratio of a longest side to a shortest side of the four straight sides of the PN junction structure is smaller than 3, and an area of the light emitting surface of the PN junction structure is smaller than 0.06 mm². The partial P-type Ohmic contact layer is located below the light emitting region base and the extending platform, and the partial P-type Ohmic contact layer comprises a P-type Ohmic contact area and a P-type non-Ohmic contact area. The P-type Ohmic contact area is located below the central area and is in Ohmic contact with the high-concentration P-type semiconductor layer, and the P-type non-Ohmic contact area is in non-Ohmic contact with the high-concentration P-type semiconductor layer.

The insulating layer is formed on the extending platform, wherein the insulating layer extends to cover a part of the N-type semiconductor to form a border covering region on the four straight sides of the PN junction structure, and the border covering region surrounds the N-type semiconductor. The bridging connected metal layer is arranged on the insulating layer, and two ends of the bridging connected metal layer extend to the border covering region and the extending platform, respectively.

The N-type Ohmic contact electrode surrounds and is in Ohmic contact with a peripheral surface of the N-type semiconductor above the active layer of the PN junction structure, and the N-type Ohmic contact electrode covers the border covering region, the P-type semiconductor below the central area of the PN junction structure is electrically connected with the P-type Ohmic contact area; and the N-type Ohmic contact electrode extends to the border covering region and is electrically connected with the bridging connected metal layer. The N-type electrode pad is formed on the bridging connected metal layer and above the extending platform, wherein the N-type electrode pad is electrically connected with the bridging connected metal layer.

According to the above disclosure, a current conducted by the N-type electrode pad sequentially passes through the bridging connected metal layer, converges from the N type ohmic contact electrode, passes downwardly through the central area of the PN junction structure, and gathers in the central of the active layer to achieve carrier recombination luminous. As light is emitted from a position above the central of the active layer without shading, expect for capability of improving the light emitting efficiency, a black proportion may further be increased if the present invention is used for the small-pitch display, and better contrast of the display is achieved. In addition, the N-type electrode pad of this design is not located on the PN junction structure, so that there is no problem that the PN junction structure is destroyed by a wire bonding process, and the demand on high reliability may be met.

DETAILED DESCRIPTION OF THE PREFERRED EMBODIMENTS

Figure 1:
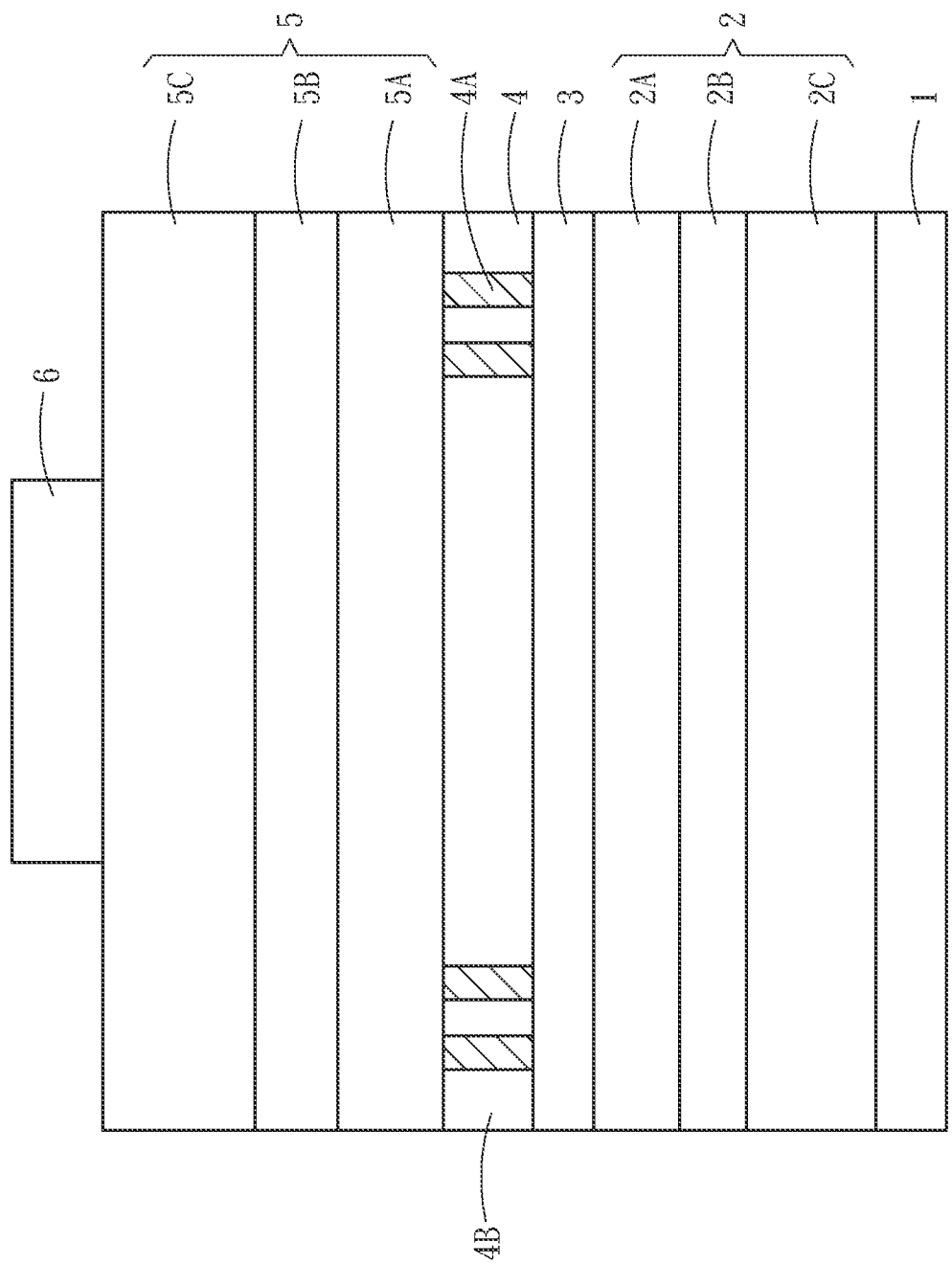
FIG. 1 is a schematic cross-sectional diagram of a structure of a conventional small-size vertical-type LED.
Figure 2:
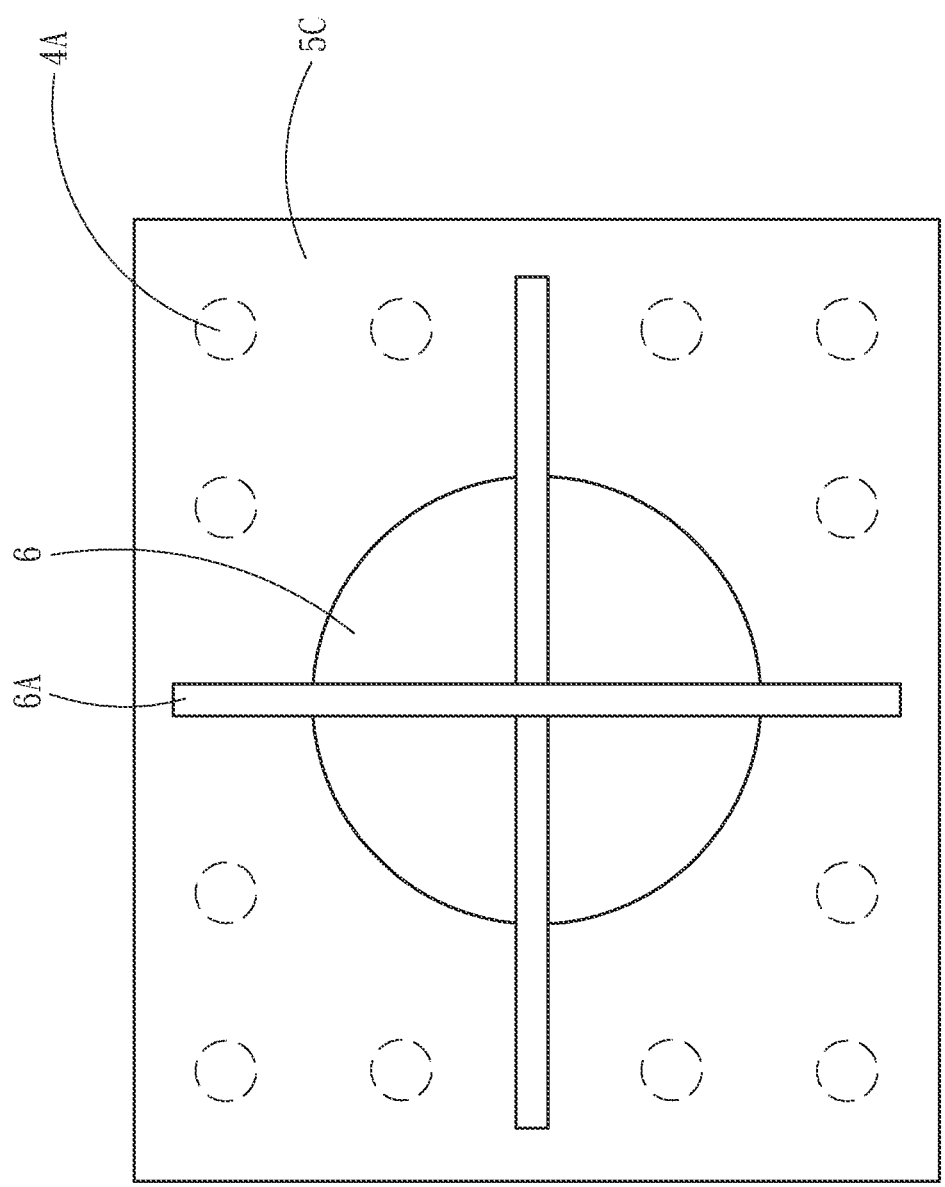
FIG. 2 is a structural plan view of a conventional small-size vertical-type LED.
Figure 3:
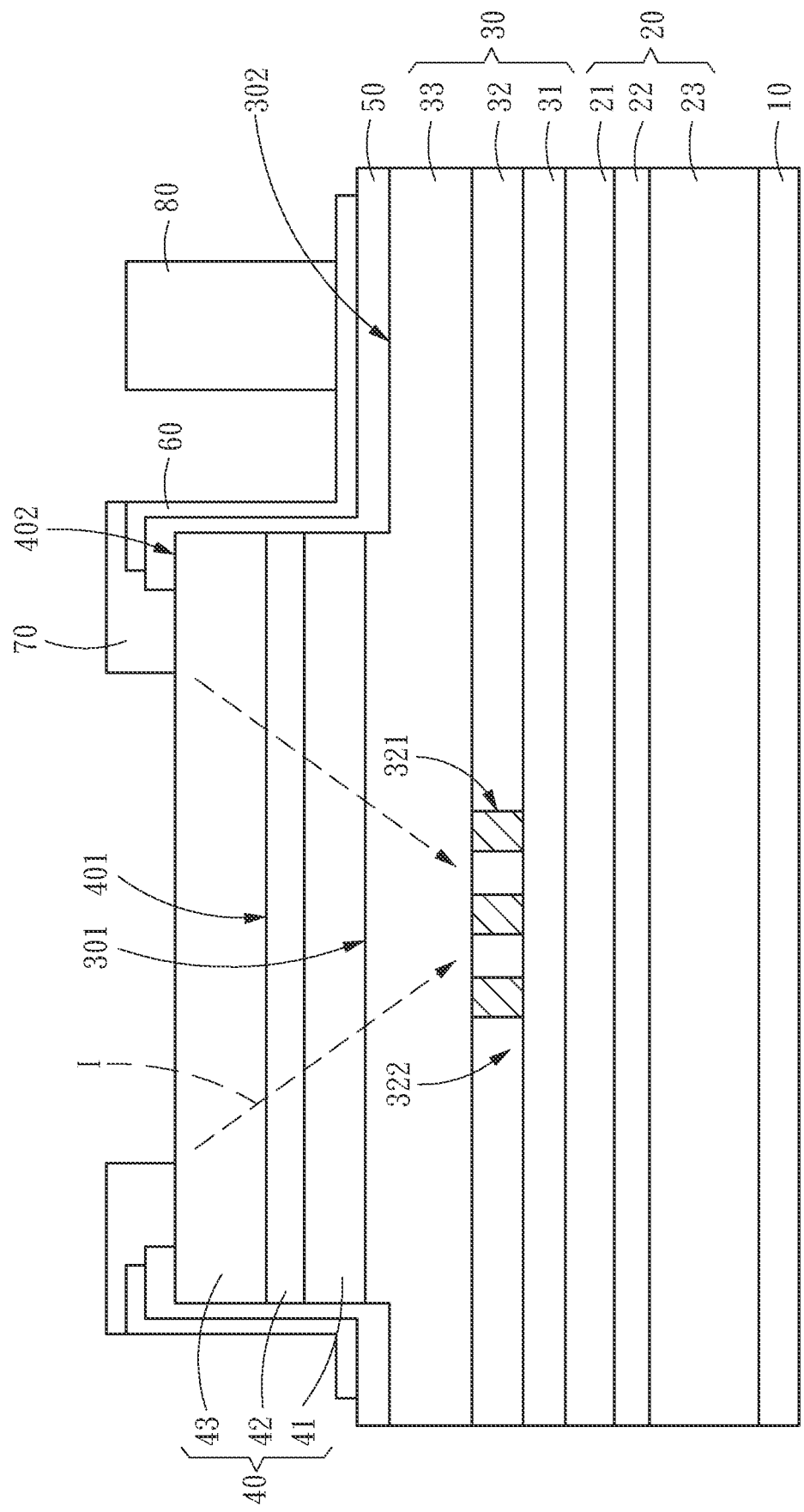
FIG. 3 is a schematic cross-sectional diagram of a chip structure according to the first embodiment of the present invention.

In order to make deeper understanding and identification on the features, the objective and the efficiency of the present invention for your commission, description is made by enumerating one preferred embodiment in cooperation with the drawings as follows:

Referring to FIG. 3, it shows the first embodiment of the present invention, comprising a P-type electrode 10, a chip conductive substrate 20, an interface structure 30, a PN junction structure 40, an insulating layer 50, a bridging connected metal layer 60, an N-type Ohmic contact electrode 70 and an N-type electrode pad 80, wherein the P-type electrode 10 is arranged on one side of the chip conductive substrate 20, and the interface structure 30 is arranged on one side, away from the P-type electrode 10, of the chip conductive substrate 20. The chip conductive substrate 20 comprises a structure metal layer 21, an alternative substrate bonding layer 22 and an alternative substrate 23. In an embodiment, the interface structure 30 comprises a highly-conductive metal layer 31, a partial P-type Ohmic contact layer 32 and a translucent high-concentration P-type semiconductor layer 33 which are stacked in sequence, the interface structure 30 has a light emitting region base 301 and an extending platform 302, and the extending platform 302 is adjacent to the light emitting region base 301.

Figure 4A:
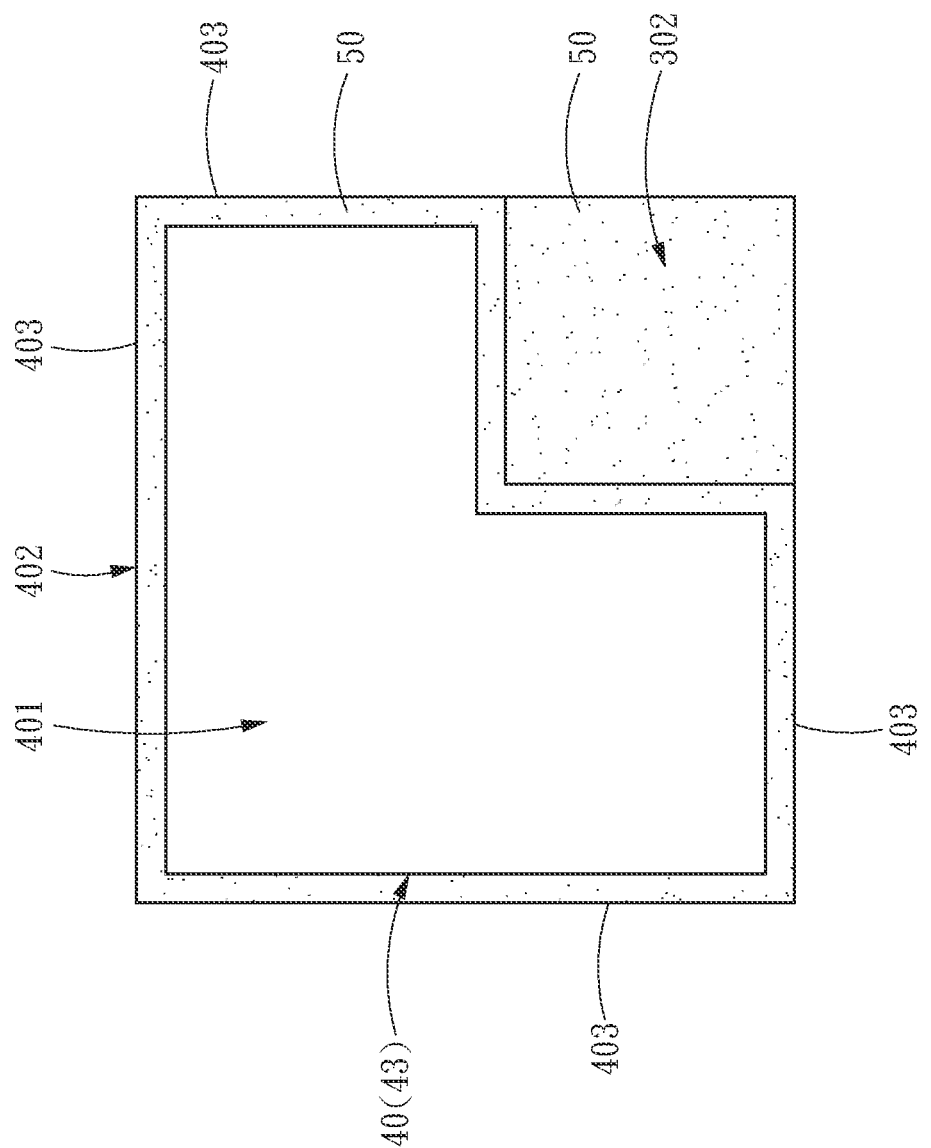
FIG. 4A is a first plan view of a chip structure according to the first embodiment of the present invention.

The PN junction structure 40 is selected from any one of a light emitting diode structure of a single PN junction or a tunnel junction light emitter diode structure of two PN junctions. In an embodiment, the PN junction structure 40 comprises a P-type semiconductor 41, an active layer 42 and an N-type semiconductor 43 which are stacked in sequence from bottom to top, the P-type semiconductor 41 is arranged on the light emitting region base 301, and a thickness of a highest-thickness region of the N-type semiconductor 43 is larger than 2.5 μm and is largely beneficial to inward conduction of an edge current. As shown in FIG. 4A, in an embodiment, the PN junction structure 40 is a closed geometric figure and has a central region 401, and the area of the light emitting surface of the PN junction structure 40 is smaller than 0.06 mm² (a small area facilitates that the current is conducted to the central region 401 of the PN junction structure 40 by an Ohmic contact border with passing through the N-type semiconductor 43).

The partial P-type Ohmic contact layer 32 is located below the light emitting region base 301 and the extending platform 302 and comprises a P-type Ohmic contact area 321 and a P-type non-Ohmic contact area 322, and the P-type Ohmic contact area 321 is located below the central region 401. The P-type Ohmic contact area 321 makes Ohmic contact with the high-concentration P-type semiconductor layer 33, whereas the P-type non-Ohmic contact area 322 makes non-Ohmic contact with the high-concentration P-type semiconductor layer 33, wherein if the high-concentration P-type semiconductor layer is made of any one of P-type gallium nitride (p-GaN) or P-type indium-gallium nitride (p-Ga$_{(x)}$ In$_{(1-x)}$ N), a high-concentration dopant is magnesium (Mg), and the P-type Ohmic contact area may be made of silver (Ag), nickel (Ni) or tin indium oxide (ITO); and if the high-concentration P-type semiconductor layer is made of any one of P-type gallium phosphide (p-GaP), P-type indium-gallium phosphide (p-Ga$_{(x)}$ In$_{(1-x)}$ P), P-type gallium arsenide (p-GaAs) or P-type indium-gallium arsenide (p-Ga$_{(x)}$ In$_{(1-x)}$ As), a high-concentration dopant is selected from any one of carbon (C) and the magnesium (Mg), and the P-type Ohmic contact area may be made of beryllium-gold alloy (BeAu Alloy).

In an embodiment, the P-type Ohmic contact area 321 is a plurality of discontinuous regions, for example, may be of a plural columnar (for example, a material, which may make Ohmic contact with the p-GaP, of a phosphide LED chip is of a BeAu columnar structure) structure; and in order to improve the electric conductivity, the P-type Ohmic contact area 321 may more vertically extend up and down (not shown) to the highly-conductive metal layer 31 and the high-concentration P-type semiconductor layer 33 respectively. Whereas the highly-conductive metal layer 31 achieves high transverse current conduction through chemically-stable and highly-conductive metal and may be made of Ag, Au, Al, Ti, TiW or Pt.

Referring to FIGS. 4A-4C again, it shows laying schematic diagrams of the insulating layer 50, the bridging connected metal layer 60, the N-type Ohmic contact electrode 70 and the N-type electrode pad 80. In order to clearly express a hierarchical relationship between various layers of structures, various layers of structures are drawn in a non-transparent mode. Firstly, as shown in FIG. 4A, in order to lay the insulating layer 50, the insulating layer 50 is formed on the extending platform 302, extends to cover the N-type semiconductor 43 and forms the border covering region 402 at the four straight sides 403, and the border covering region 402 surrounds the N-type semiconductor 43. The insulating layer 50 is formed by laying an SiO$_2$ insulating material with a thickness larger than 500 nm through PECVD with isotropic deposition generally and thus may be better in adhesive force to the side wall of the PN junction structure 40.

Figure 4B:
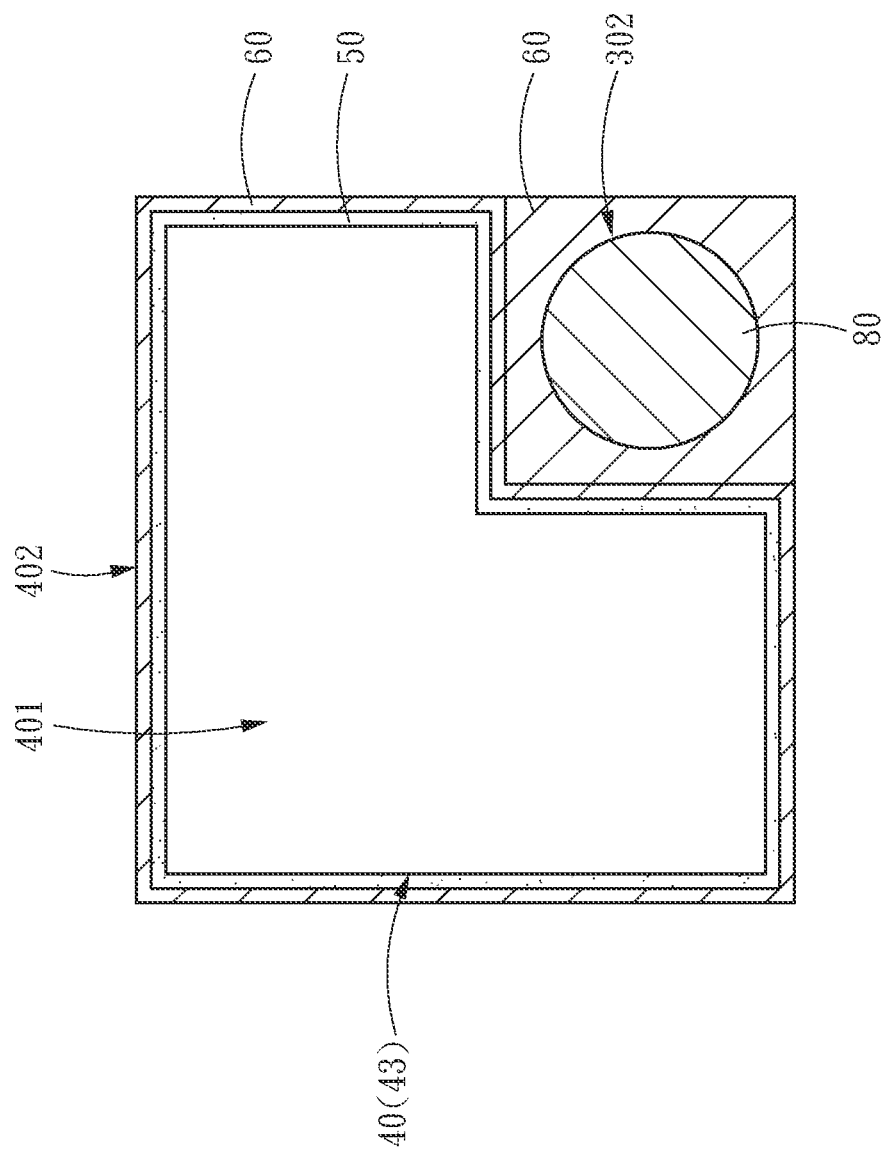
FIG. 4B is a second plan view of a chip structure according to the first embodiment of the present invention.

Then, as shown in FIG. 4B, in order to lay the bridging connected metal layer 60 and the N-type electrode pad 80, the bridging connected metal layer 60 is arranged on the insulating layer 50, and the two ends of the bridging connected metal layer 60 extend onto the border covering region 402 and the extending platform 302 respectively. The N-type electrode pad 80 is formed on the bridging connected metal layer 60, corresponding to the extending platform 302, so as to be electrically connected with the bridging connected metal layer 60. The N-type electrode pad on the extending platform 302 is circular, and about 3 μm of gold (Au) deposits on the N-type electrode pad for facilitating subsequent packaging wire bonding.

Figure 4C:
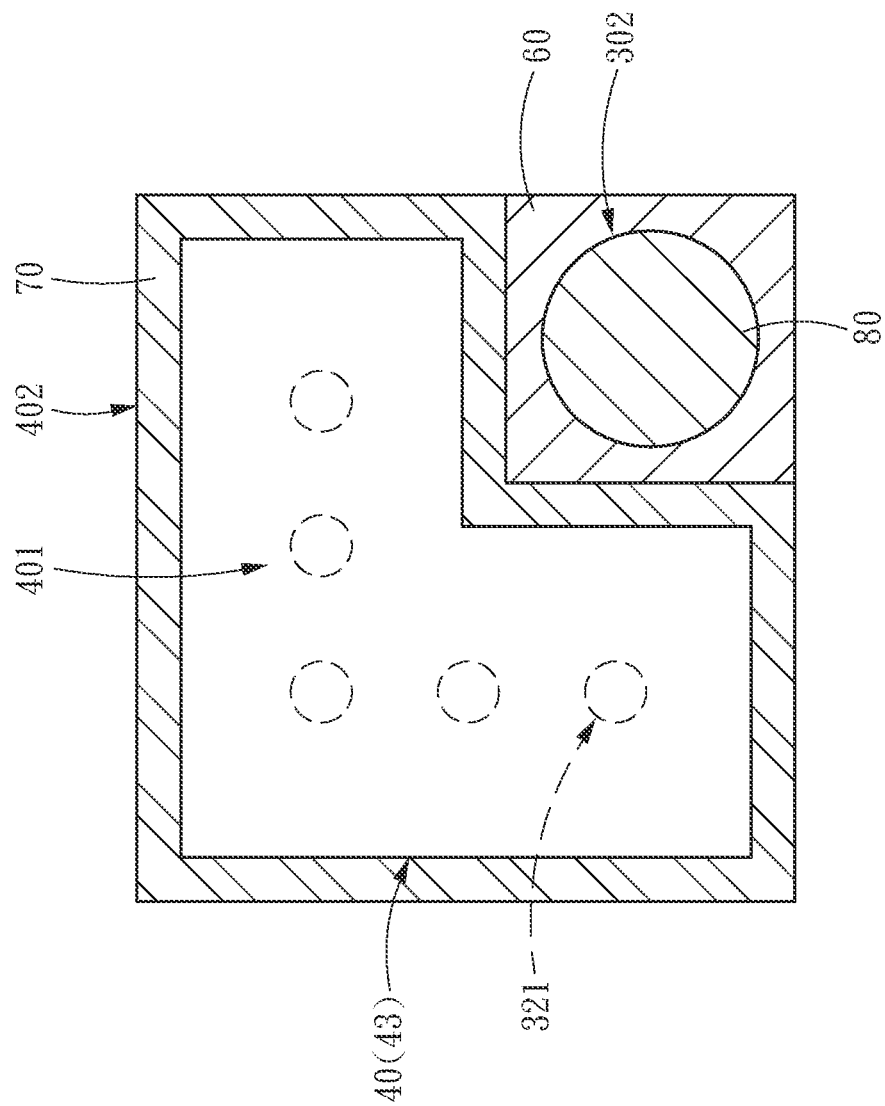
FIG. 4C is a third plan view of a chip structure according to the first embodiment of the present invention.

Then, as shown in FIG. 4C, in order to lay the N-type Ohmic contact electrode 70, the N-type Ohmic contact electrode 70 surrounds and makes Ohmic contact with the surface of the N-type semiconductor 43 of the peripheral region above the PN junction structure 40 and covers the border covering region 402; whereas the P-type semiconductor 41 of the central region below the PN junction structure 40 is electrically connected with the P-type Ohmic contact area 321 (as shown in FIG. 3); also, the N-type Ohmic contact electrode 70 extends onto the border covering region 402 and is electrically connected with the bridging connected metal layer 60; and in FIG. 4C, the positions of the P-type Ohmic contact areas 321 are further drawn so as to clearly show the relative position relationship between the N-type Ohmic contact electrode 70 and the P-type Ohmic contact areas 321. Thus, a current I introduced by the N-type electrode pad 80 may pass through the bridging connected metal layer 60 (as shown in FIG. 3) and passes through the central region 401 of the PN junction structure 40 downwards in a cohesion manner through the N-type Ohmic contact electrode 70.

Figure 5:
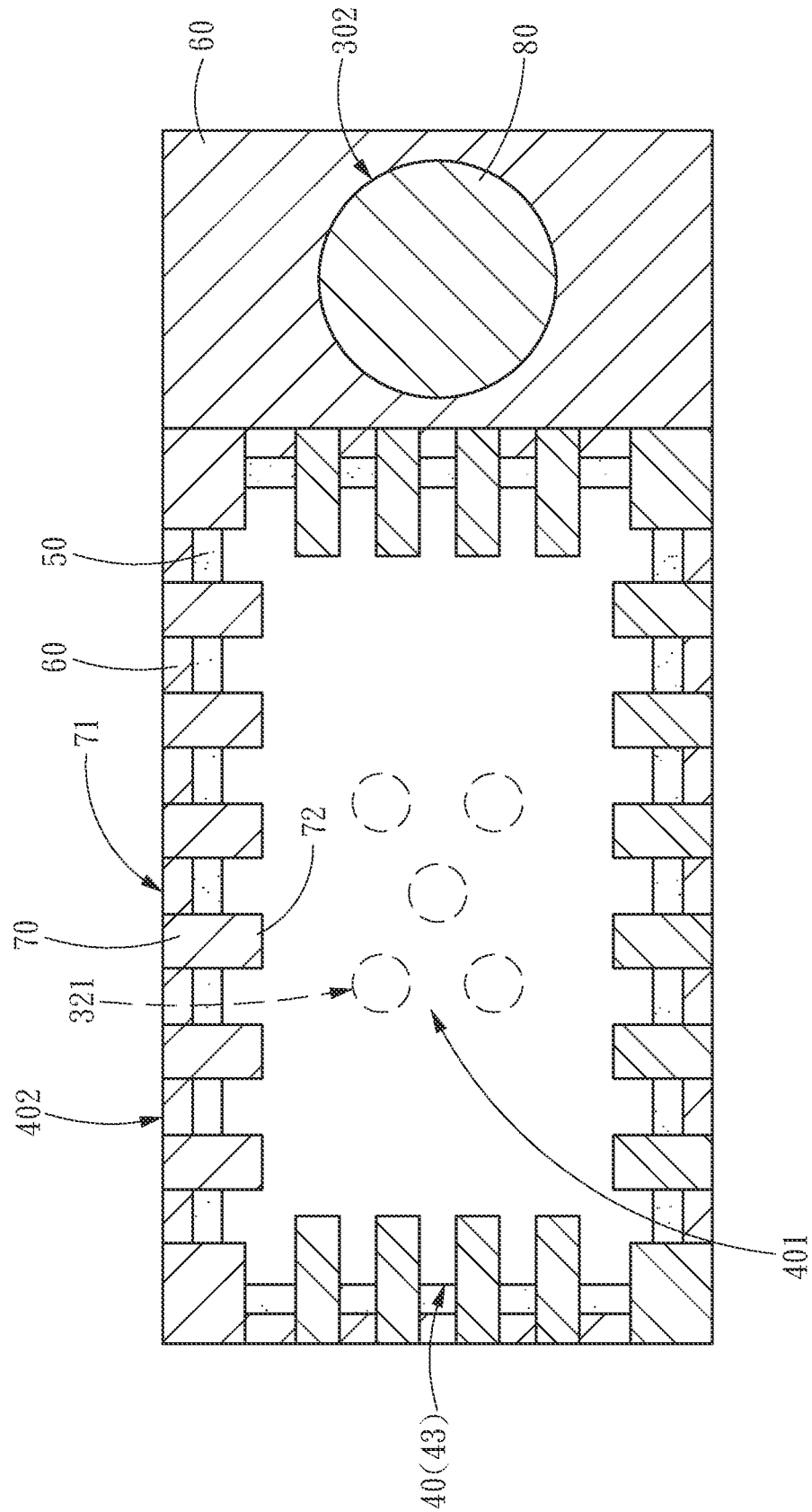
FIG. 5 is a schematic cross-sectional diagram of a chip structure according to the second embodiment of the present invention.

Referring to FIG. 5, it shows a plan view of a chip structure according to the second embodiment. In order to adjust N-type Ohmic contact current diffusion, the N-type Ohmic contact electrode 70 is of a dispersed structure and has at least one exposing opening 71, and the at least one exposing opening 71 extends to the boundary of the PN junction structure 40. Thus, the shading area may be reduced, and the area of each Ohmic contact region may be more easily controlled. In addition, in an embodiment, the N-type Ohmic contact electrode 70 may further have at least one extension electrode 72 extending into the central region 401, and the area of the extension electrode 72 is smaller than or equal to 25% of the area of the central region 401, so that the quantity of the current I passing through the central region 401 of the PN junction structure 40 may be increased. In addition, in this embodiment, the chip structure of the PN junction structure 40 is in a shape of a rectangle, the PN junction structure 40 is a closed figure with four straight sides 403, a ratio of the longest side to the shortest side of the four straight sides 403 is smaller than 3 (tending to be a square with symmetrical inward gathering of the current), and the rectangle facilitates arrangement of a plurality of chip structures 40 in a single package.

Figure 6:
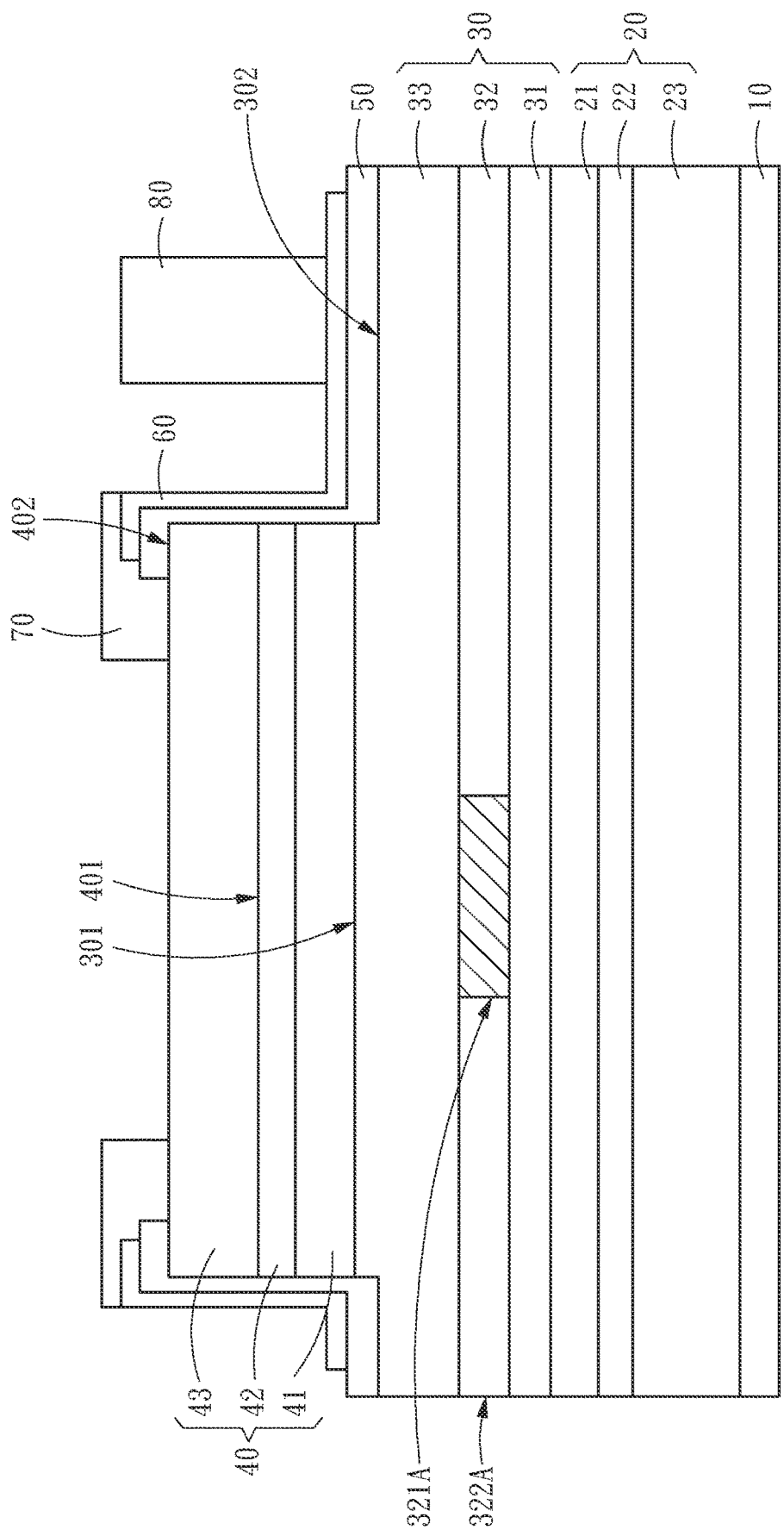
FIG. 6 is a schematic cross-sectional diagram of a chip structure according to the third embodiment of the present invention.

Referring to FIG. 6, it shows a schematic cross-sectional diagram of a chip structure according to the third embodiment of the present invention, in which the P-type Ohmic contact area 321A is selected from a continuous integral single region, the P-type non-Ohmic contact area 322A may be made of any one of a transparent translucent dielectric material, such as silicon dioxide (SiO$_2$), titanium dioxide (TiO$_2$), silicon nitride (SiN), magnesium fluoride (MgF$_2$) and (ITO), or a high-reflective metal material in non-Ohmic contact with the high-concentration P-type semiconductor layer 33, such as aluminum (Al), silver (Ag) and gold (Au).

Figure 7:
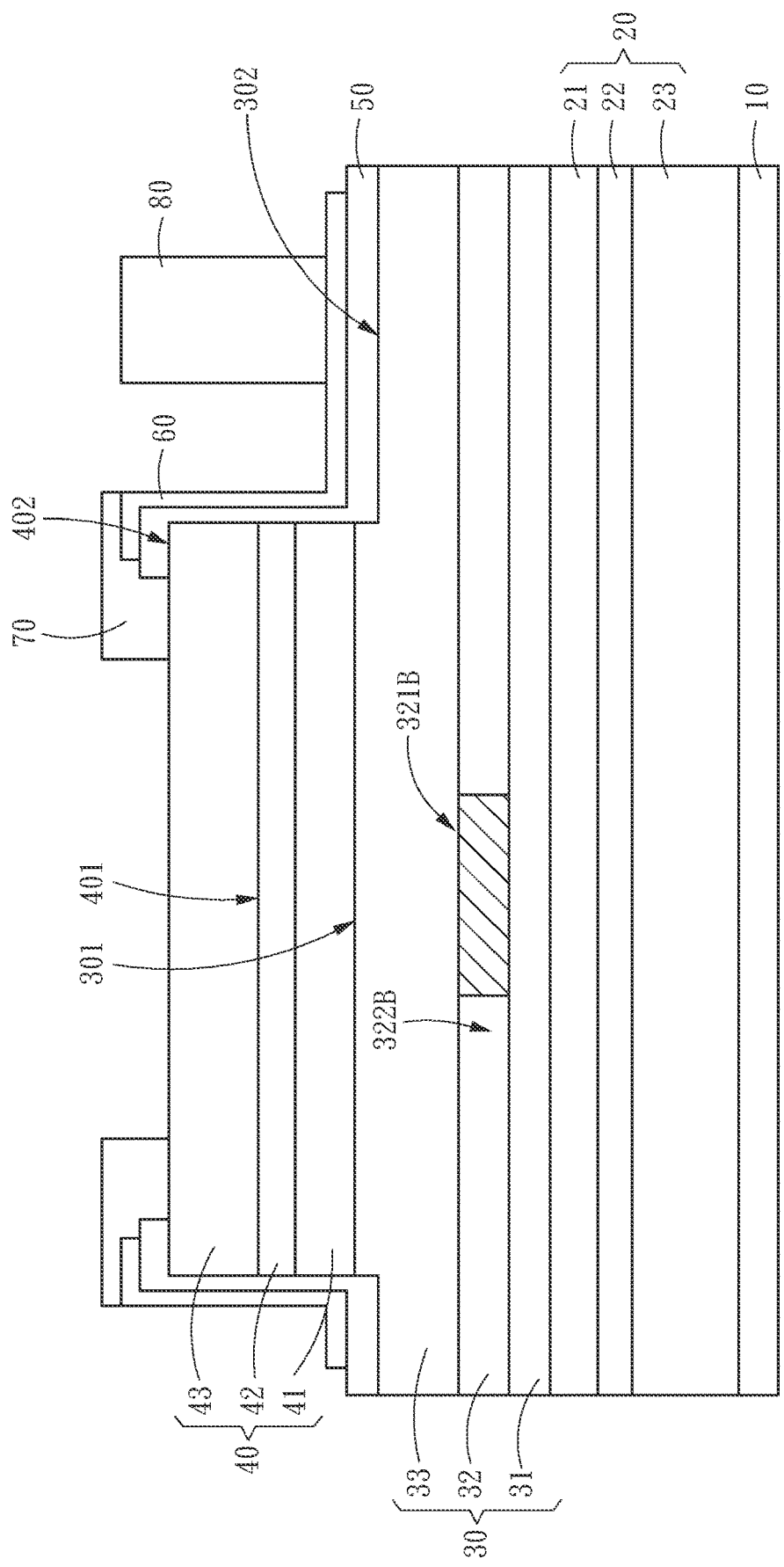
FIG. 7 is a schematic cross-sectional diagram of a chip structure according to the fourth embodiment of the present invention.

Referring to FIG. 7, it shows a schematic cross-sectional diagram of a chip structure according to the fourth embodiment of the present invention, in which the extending platform 302 is arranged on the high-concentration P-type semiconductor layer 33 and is of an epitaxial structure with a thick P-type semiconductor (a P-type cladding layer plus the high-concentration P-type semiconductor layer), for example, a phosphide LED epitaxial structure has a thick-GaP high-concentration P-type semiconductor epitaxial layer; the high-concentration P-type semiconductor layer 33 may be made of any one of Mg or C-doped P-type indium-gallium phosphide (p-Ga$_{(x)}$ In$_{(1-x)}$ P) or P-type gallium phosphide (p-GaP), and the thickness of the high-concentration P-type semiconductor layer 33 is larger than 2 μm; whereas in this embodiment, the P-type Ohmic contact area 321B takes the BeAu alloy as an Ohmic contact material, and the P-type non-Ohmic contact area 322B may be made of the high-reflective metal material, such as Al, Ag and Au.

Figure 8:
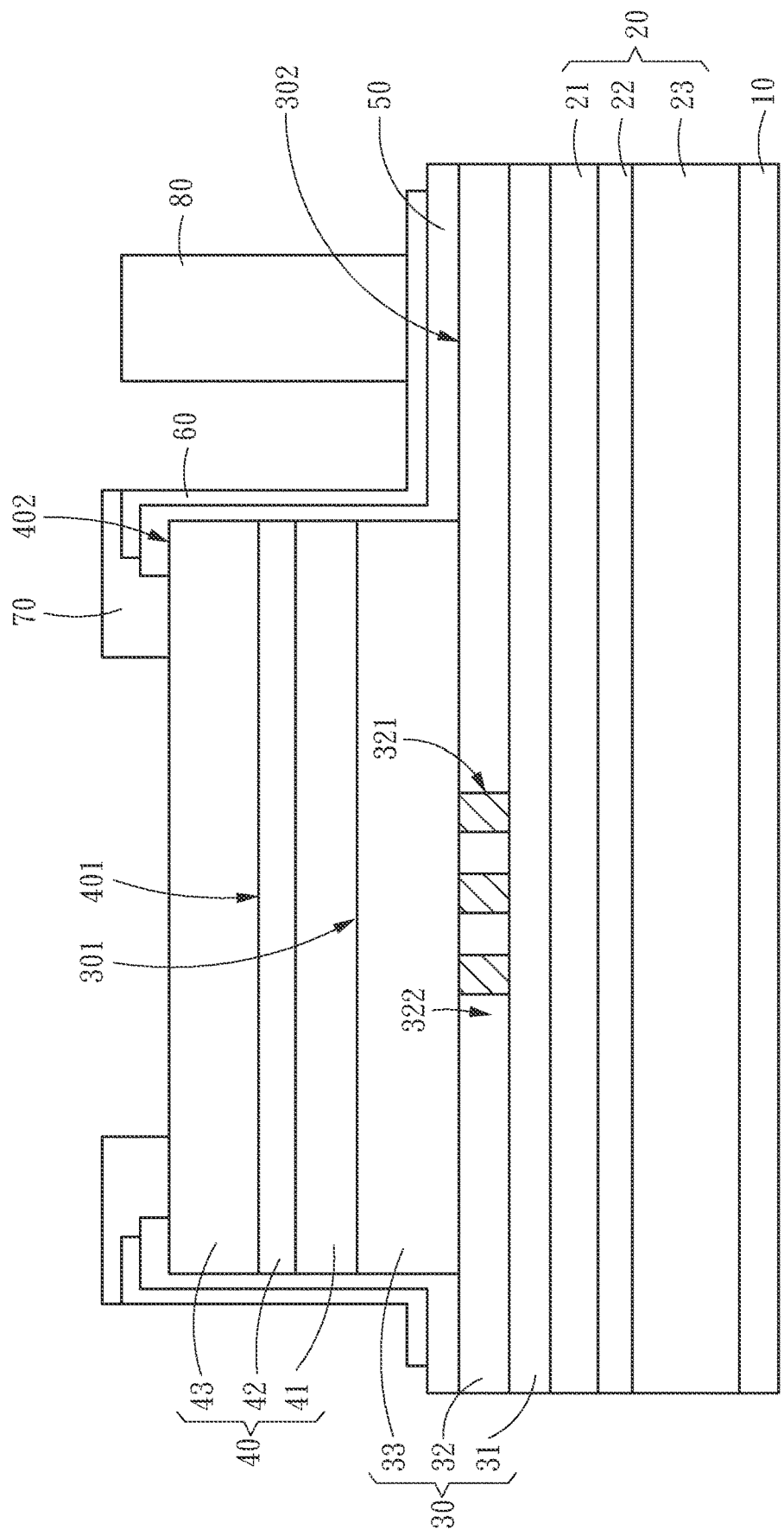
FIG. 8 is a schematic cross-sectional diagram of a chip structure according to the fifth embodiment of the present invention.

Referring to FIG. 8, it shows a schematic cross-sectional diagram of a chip structure according to the fifth embodiment of the present invention, in which the extending platform 302 is arranged on the partial P-type Ohmic contact layer 32, which may strengthen the insulating effect of the insulating layer 50 in this embodiment, but an etching depth requires to be accurately controlled.

Figure 9:
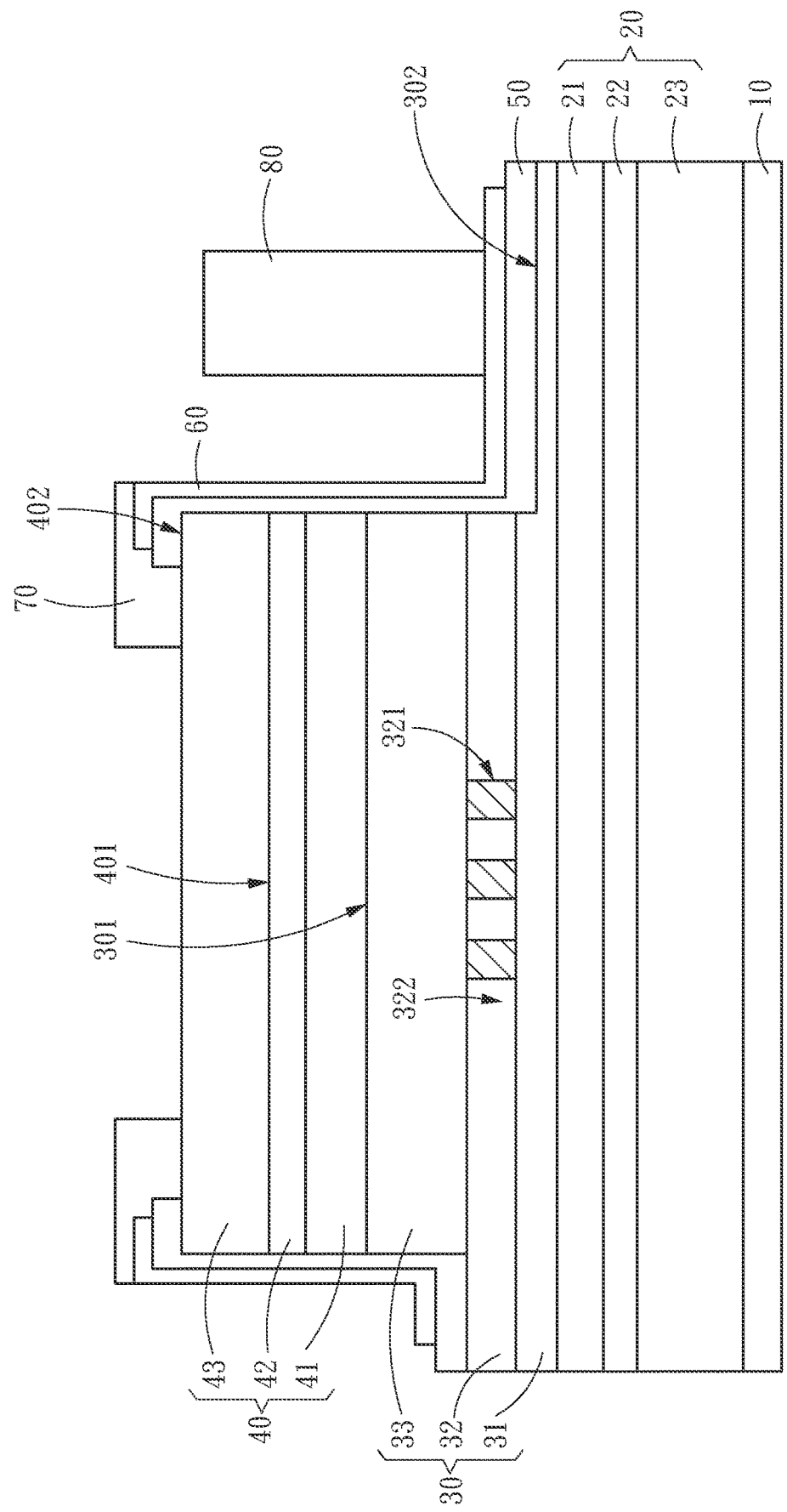
FIG. 9 is a schematic cross-sectional diagram of a chip structure according to the sixth embodiment of the present invention.

Referring to FIG. 9, it shows a schematic cross-sectional diagram of a chip structure according to the sixth embodiment of the present invention, in which if the high-concentration P-type semiconductor layer 33 is made of any one of Mg-doped P-type gallium nitride (p-GaN) or P-type indium-gallium nitride (p-Ga$_{(x)}$ In$_{(1-x)}$ N), the thickness of the high-concentration P-type semiconductor layer 33 is smaller than 0.5 μm, and the extending platform 302 is arranged on the highly-conductive metal layer 31.

As mentioned above, the present invention at least has the following characteristics:

1. The current introduced by the N-type electrode pad may pass through the bridging connected metal layer, pass to the P-type Ohmic contact area in the central downwards by the N-type Ohmic contact electrode in the cohesion manner and may pass through the central region of a light emitting layer in the PN junction structure, and the N-type Ohmic contact electrode covers the border covering region and is located at the periphery of the PN junction structure without shading the central region; and as the PN junction structure is relatively good in epitaxial quality and emits light without shading in the central region, the demand on high luminous efficiency is met.

2. There is no PN junction structure below the N-type electrode pad, so that defects of the PN junction structure cannot be caused by wire bonding stress of the packaging process; and in addition, heat, generated by the N-type electrode pad contacting with a resistor, cannot be conducted to the active layer downwards to affect the carrier recombination efficiency like a conventional structure.

What is claimed is:

1. A small-size vertical-type light emitting diode chip with high luminous in a central region, comprising:
   a P-type electrode;
   a chip conductive substrate, wherein the P-type electrode is arranged on one side of the chip conductive substrate;
   an interface structure, arranged on one side of the chip conductive substrate opposite to the P-type electrode, and comprising a highly-conductive metal layer, a partial P-type Ohmic contact layer and a high-concentration P-type semiconductor layer which are stacked in sequence, the high-concentration P-type semiconductor layer is light-transmitting, and the interface structure further comprising a light emitting region base and an extending platform adjacent to the light emitting region base;
   a PN junction structure, comprising a P-type semiconductor, an active layer and an N-type semiconductor which are stacked in sequence, wherein the P-type semiconductor is arranged on the light emitting region base, the PN junction structure is a closed figure with four straight sides to form a central area, a ratio of a longest side to a shortest side of the four straight sides of the PN junction structure is smaller than 3, and an area of a light emitting surface of the PN junction structure is smaller than 0.06 mm$^2$, the partial P-type Ohmic contact layer is located below the light emitting region base and the extending platform, and the partial P-type Ohmic contact layer comprises a P-type Ohmic contact area located below the central region and a non-P-type-Ohmic contact area, and the P-type Ohmic contact area is in Ohmic contact with the high-concentration P-type semiconductor layer, and the non-P-type-Ohmic contact area is in non-Ohmic contact with the high-concentration P-type semiconductor layer;
   an insulating layer, formed on the extending platform, wherein the insulating layer extends to cover a part of the N-type semiconductor to form a border covering region on the four straight sides of the PN junction structure, and the border covering region surrounds the N-type semiconductor;
   a bridging connected metal layer, arranged on the insulating layer, and two ends of the bridging connected metal layer extending to the border covering region and the extending platform, respectively;
   an N-type Ohmic contact electrode, wherein the N-type Ohmic contact electrode surrounds and is in Ohmic contact with a peripheral surface of the N-type semiconductor above the active layer of the PN junction structure, and the N-type Ohmic contact electrode covers the border covering region, the P-type semiconductor below the central area of the PN junction structure is electrically connected with the P-type Ohmic contact area, and the N-type Ohmic contact electrode extends to the border covering region and is electrically connected with the bridging connected metal layer; and
   an N-type electrode pad, formed on the bridging connected metal layer and above the extending platform, wherein the N-type electrode pad is electrically connected with the bridging connected metal layer.

2. The small-size vertical-type light emitting diode chip according to claim 1, wherein a thickness of a highest-thickness region of the N-type semiconductor is larger than 2.5 μm.

3. The small-size vertical-type light emitting diode chip according to claim 1, wherein the PN junction structure is selected from any one of a light emitting diode structure of a single PN junction or a tunnel junction light emitter diode structure of two PN junctions.

4. The small-size vertical-type light emitting diode chip according to claim 1, wherein the N-type Ohmic contact electrode comprises at least one exposing opening, and the at least one exposing opening extends to a periphery of the PN junction structure.

5. The small-size vertical-type light emitting diode chip according to claim 1, wherein the N-type Ohmic contact electrode comprises at least one extension electrode extending into the central region.

6. The small-size vertical-type light emitting diode chip according to claim 1, wherein the high-concentration P-type semiconductor layer is selected from any one of P-type gallium nitride or P-type indium-gallium nitride, a high-concentration dopant is magnesium, and the P-type Ohmic contact area is made of silver, nickel, or tin indium oxide.

7. The small-size vertical-type light emitting diode chip according to claim 1, wherein the high-concentration P-type semiconductor layer is selected from any one of P-type gallium phosphide, P-type indium-gallium phosphide, P-type gallium arsenide and P-type indium-gallium arsenide, a high-concentration dopant is selected from any one of carbon and magnesium, and the P-type Ohmic contact area is made of beryllium-gold alloy.

8. The small-size vertical-type light emitting diode chip according to claim 1, wherein the non-P-type-Ohmic contact area is selected from any one of a transparent and light-transmitting dielectric material or a high-reflective metal material in non-Ohmic contact with the high-concentration P-type semiconductor.

9. The small-size vertical-type light emitting diode chip according to claim 1, wherein the P-type Ohmic contact area is selected from any one of a continuous integral single region or a plurality of discontinuous regions.

10. The small-size vertical-type light emitting diode chip according to claim 1, wherein the P-type Ohmic contact area vertically extends up and down to the highly-conductive metal layer and the high-concentration P-type semiconductor layer, respectively.

11. The small-size vertical-type light emitting diode chip according to claim 1, wherein the extending platform is arranged on any one of the highly-conductive metal layer, the partial P-type Ohmic contact layer and the high-concentration P-type semiconductor layer.

12. The small-size vertical-type light emitting diode chip according to claim 1, wherein the high-concentration P-type semiconductor layer is selected from any one of Mg-doped P-type gallium nitride or P-type indium-gallium nitride, a thickness of the high-concentration P-type semiconductor layer is smaller than 0.5 μm, and the extending platform is arranged on the highly-conductive metal layer.

13. The small-size vertical-type light emitting diode chip according to claim 1, wherein the high-concentration P-type semiconductor layer is selected from any one of Mg or C-doped P-type indium-gallium phosphide or P-type gallium phosphide, a thickness of the high-concentration P-type semiconductor layer is larger than 2 μm, and the extending platform is arranged on the highly-conductive metal layer.

\* \* \* \* \*